(12) United States Patent
Nadeau-Dostie (10) Patent No.: US 11,430,537 B2
(45) Date of Patent: Aug. 30, 2022

(54) ERROR-CORRECTING CODE-ASSISTED MEMORY REPAIR

(71) Applicant: Siemens Industry Software Inc., Plano, TX (US)

(72) Inventor: Benoit Nadeau-Dostie, Gatineau (CA)

(73) Assignee: Siemens Industry Software Inc., Plano, TX (US)

( * ) Notice: Subject to any disclaimer, the term of this patent is extended or adjusted under 35 U.S.C. 154(b) by 0 days.

(21) Appl. No.: 17/115,894

(22) Filed: Dec. 9, 2020

(65) Prior Publication Data

US 2021/0174892 A1 Jun. 10, 2021

Related U.S. Application Data

(60) Provisional application No. 62/945,317, filed on Dec. 9, 2019.

(51) Int. Cl.
*G11C 29/42* (2006.01)
*G11C 11/16* (2006.01)
*G11C 29/44* (2006.01)

(52) U.S. Cl.
CPC .......... *G11C 29/42* (2013.01); *G11C 11/1673* (2013.01); *G11C 11/1675* (2013.01); *G11C 29/4401* (2013.01)

(58) Field of Classification Search
None
See application file for complete search history.

(56) References Cited

U.S. PATENT DOCUMENTS

| 7,206,988 B1 | 4/2007 | Solt |
| 2015/0026537 A1* | 1/2015 | Romanovskyy .... G06F 11/1008 714/764 |
| 2020/0111537 A1 | 4/2020 | Chen et al. |
| 2020/0194093 A1* | 6/2020 | Chen ..................... G06F 11/102 |

OTHER PUBLICATIONS

Artur Antonyan et al., "Embedded MRAM Macro for eFlash Replacement", 2018 IEEE International Symposium on Circuits and Systems (ISCAS), 2018, 4 pgs.

(Continued)

*Primary Examiner* — Guerrier Merant (57) ABSTRACT

A memory-testing circuit configured to perform a test of a memory comprising error-correcting code circuitry comprises repair circuitry configured to allocate a spare row or row block in the memory for a defective row or row block in the memory, a defective row or row block being a row or row block in which a memory word has a number of error bits greater than a preset number, wherein the test of the memory comprises: disabling the error-correcting code circuitry, performing a pre-repair operation, the pre-repair operation comprising: determining whether the memory has one or more defective rows or row blocks, and allocating one or more spare rows or row blocks for the one or more defective rows or row blocks if the one or more spare rows or row blocks are available, and performing a post-repair operation on the repaired memory.

18 Claims, 10 Drawing Sheets

(56) References Cited

OTHER PUBLICATIONS

Yi-Chun Shih et al., "Logic Process Compatible 40-nm 16-Mb, Embedded Perpendicular-MRAM With Hybrid-Resistance Reference, Sub-µA Sensing Resolution, and 17.5-nS Read Access Time", IEEE Journal of Solid-State Circuits, vol. 54, No. 4, Apr. 2019, pp. 1029-1038.
Tze-Hsin Wu et al., "Memory Yield Improvement Scheme Combining Built-In Self-Repair and Error Correction Codes", 2012 International Test Conference, 2012, Paper 14.1, pp. 1-9.
Keiichi Kushida et al., "DFT Techniques for Memory Macro with Built-in ECC", 2005 IEEE International Workshop on Memory Technology, Design, and Testing (MTDT'05), 2005, 6 pgs.
Panagiota Papavramidou and Michael Nicolaidis, "Test Algorithms for ECC-based Memory Repair in Nanotechnologies", 2012 IEEE 30th VLSI Test Symposium (VTS), 2012, pp. 228-233.

\* cited by examiner

| D7 | D6 | D5 | D4 | D3 | D2 | D1 | D0 | |
|----|----|----|----|----|----|----|----|---|
| X  | S0 | X  | X  | X  | S1 | X  | X  | Logical data word |
|    | 0  |    |    |    | 1  |    |    | SA0 and SA1 bits |
| 0  | 0  | 0  | 0  | 0  | 1  | 0  | 0  | All 0s (pass) |
| 1  | 0  | 1  | 1  | 1  | 1  | 1  | 1  | All 1s (pass) |
| 0  | 0  | 0  | 1  | 0  | 1  | 0  | 1  | 2x2 Checkerboard (pass) |
| 1  | 0  | 1  | 0  | 1  | 1  | 1  | 0  | 2x2 Inverse checkerboard (pass) |
| X  | 1  | X  | X  | X  | 0  | X  | X  | User data (fail) |

FIG. 10

ERROR-CORRECTING CODE-ASSISTED MEMORY REPAIR

RELATED APPLICATIONS

This application claims the benefit of U.S. Provisional Patent Application No. 62/945,317, filed on Dec. 9, 2019, which application is incorporated entirely herein by reference.

FIELD OF THE DISCLOSED TECHNIQUES

The presently disclosed techniques relates to memory testing. Various implementations of the disclosed techniques may be particularly useful for improving the manufacturing yield of embedded memories with error-correcting code capability.

BACKGROUND OF THE DISCLOSED TECHNIQUES

Current high-density semiconductors often include embedded memories. Designed tightly to the technology limits, memories are more prone to failures than other circuits, affecting yield adversely. Built-in self-test (BIST) techniques are employed to identify defects and problems in the memories. Moreover, these circuits usually include built-in self-repair (BISR) circuitry for performing a repair analysis (built-in repair analysis or BIRA) and for replacing faulty elements with spare ones.

Memories are also subject to errors caused by cosmic rays and alpha particles. Passage of ionized particles through a memory can cause a disturbance sufficient to flip data stored in a memory cell. This error is called a "soft error" because no permanent damage remains in the structure of the chip and the disturbed memory cell is thereafter reusable for storing data. Error-correcting code (ECC) techniques not only are a good solution to the soft error problem of memories, but can be used to cope with fabrication faults affecting a small number of cells (e.g., one or two cells) of a memory word. For low fabrication-fault rates, ECC may even eliminate the need for BISR circuitry.

Combining the ECC and BISR techniques together, the number of repairable faults in memories can increase significantly. This is especially useful for magnetoresistive random access memory, or MRAM, a novel non-volatile memory. While MRAM holds promising potential to be used for various applications, ranging from stand-alone main memory, last-level cache, to embedded non-volatile memory, the manufacture yield is still low if using conventional row and column repair techniques alone. Challenges, however, remain in combining conventional memory repair with ECC.

BRIEF SUMMARY OF THE DISCLOSED TECHNIQUES

Various aspects of the disclosed technology relate to test and repair memories having error-correcting code circuitry. In one aspect, there is a memory-testing circuit in a circuit configured to perform a test of a memory in the circuit, the memory comprising error-correcting code circuitry configured to detect and correct no more than a first preset number of error bits per memory word detected in the memory, the memory-testing circuit comprising: a test controller; and repair circuitry configured to allocate a spare row or row block in the memory for a defective row or row block in the memory, a defective row or row block being a row or row block in which a memory word has a number of error bits greater than a second preset number, the second preset number being equal to or smaller than the first preset number, wherein the test of the memory comprises: disabling the error-correcting code circuitry by the test controller, performing a pre-repair operation, the pre-repair operation comprising: determining whether the memory has one or more defective rows or row blocks, and allocating one or more spare rows or row blocks for the one or more defective rows or row blocks if the one or more spare rows or row blocks are available, and performing a post-repair operation, the post-repair operation comprising: determining whether the memory has one or more new defective rows or row blocks after the pre-repair operation, and allocating one or more new spare rows or row blocks for the one or more new defective rows or row blocks if the one or more new spare rows or row blocks are available.

Each of the determining whether the memory has one or more defective rows or row blocks and the determining whether the memory has one or more new defective rows or row blocks after the pre-repair operation may comprise: selecting a reference address; and performing a series of write and read operations while accumulating results for the reference address. The series of write and read operations may comprise writing and reading at the reference address and addresses other than the reference address, and the results for the reference address are derived by comparing bits at the reference address with expected bit values. The series of write and read operations may comprise reading a value of 0 and 1 from all bits of the reference address.

The memory-testing circuit may further comprise: a comparator configured to compare bit values from outputs of the memory with expected bit values; an accumulator configured to accumulate results of the comparing for each of the outputs of the memory and to indicate whether at least one error occurred in the each of the outputs of the memory after a series of write and read operations for a reference address selected by the test controller; and a fail count device configured to count a number of failing bit positions at the reference address and to send a signal to the repair circuitry indicating whether the number of failing bit positions exceeds the second preset number.

The repair circuitry may further be configured to allocate a spare column or column block to a column or column block if an error occurs at a bit of the column or column block located in a last row of a memory bank in either the pre-repair operation or the post-repair operation, the last row being a row farthest away from output circuitry of the memory bank.

The memory-testing circuit may further comprise a counter for each memory bit output configured to count a number of errors, and wherein the repair circuitry is further configured to allocate a spare column or column block to a column or column block having a largest number of errors if the largest number of errors is greater than a third preset number.

The test of the memory may classify the memory as: non-repairable, non-repairable memory comprising memory in which a number of defective rows or row blocks exceeds a number of available spare rows or row blocks, repair-needed, repair-needed memory comprising memory having spare rows or row blocks available for any defective rows or row blocks determined, no-repair-needed if a number of errors in any memory word is equal to or smaller than the second preset number, or error-free if no errors are detected.

The test of the memory may further comprise: determining whether a total number of errors for correction by the error-correcting code circuitry is smaller than a fourth preset number.

The test of the memory may further comprise: enabling the error-correcting code circuitry by the test controller; masking memory outputs corresponding to check bits used by the error-correcting code circuitry; performing a series of write and read operations; and comparing results the series of write and read operations with expected results.

In another aspect, there is a method for testing a memory in a circuit by using a memory-testing circuit in the circuit, comprising: disabling error-correcting code circuitry in the circuit, the error-correcting code circuitry configured to, when enabled, detect and correct no more than a first preset number of error bits per memory word detected in the memory; performing a pre-repair operation, the pre-repair operation comprising: determining whether the memory has one or more defective rows or row blocks, and allocating one or more spare rows or row blocks in the memory for the one or more defective rows or row blocks if the one or more spare rows or row blocks are available, a defective row or row block being a row or row block in which a memory word has a number of error bits greater than a second preset number, the second preset number being equal to or smaller than the first preset number; and performing a post-repair operation, the post-repair operation comprising: determining whether the memory has one or more new defective rows or row blocks after the pre-repair operation, and allocating one or more new spare rows or row blocks for the one or more new defective rows or row blocks if the one or more new spare rows or row blocks are available.

Each of the determining whether the memory has one or more defective rows or row blocks and the determining whether the memory has one or more new defective rows or row blocks after the pre-repair operation may comprise: selecting a reference address; and performing a series of write and read operations while accumulating results for the reference address. The series of write and read operations may comprise writing and reading at the reference address and addresses other than the reference address, and the results for the reference address are derived by comparing bits at the reference address with expected bit values. The series of write and read operations may comprise reading a value of 0 and 1 from all bits of the reference address.

Each of the pre-repair operation and the post-repair operation may comprise: allocating a spare column or column block to a column or column block if an error occurs at a bit of the column or column block located in a last row of a memory bank in either the pre-repair operation or the post-repair operation, the last row being a row farthest away from output circuitry of the memory bank.

Each of the pre-repair operation and the post-repair operation comprises: allocating a spare column or column block to a column or column block having a largest number of errors if the largest number of errors is greater than a third preset number.

The pre-repair operation and the post-repair operation may classify the memory as: non-repairable, non-repairable memory comprising memory in which a number of defective rows or row blocks exceeds a number of available spare rows or row blocks, repair-needed, repair-needed memory comprising memory having spare rows or row blocks available for any defective rows or row blocks determined, no-repair-needed if a number of errors in any memory word is equal to or smaller than the second preset number, or error-free if no errors are detected.

The method may further comprise: determining whether a total number of errors for correction by the error-correcting code circuitry is smaller than a fourth preset number.

The method may further comprise: enabling the error-correcting code circuitry; masking memory outputs corresponding to check bits used by the error-correcting code circuitry; performing a series of write and read operations; and comparing results the series of write and read operations with expected results.

The pre-repair operation may further comprise: reading a repair solution from non-volatile memory in the circuit; and generating incrementally a new repair solution.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed techniques. Thus, for example, those skilled in the art will recognize that the disclosed techniques may be embodied or carried out in a manner that achieves or optimizes one advantage or group of advantages as taught herein without necessarily achieving other objects or advantages as may be taught or suggested herein.

DETAILED DESCRIPTION OF THE DISCLOSED TECHNIQUES

Various aspects of the disclosed technology relate to test and repair memories having error-correcting code circuitry.

In the following description, numerous details are set forth for the purpose of explanation. However, one of ordinary skill in the art will realize that the disclosed technology may be practiced without the use of these specific details. In other instances, well-known features have not been described in details to avoid obscuring the disclosed technology.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods.

The detailed description of a method or a device sometimes uses terms like "allocate," "disable," and "perform" to describe the disclosed method or the device function/structure. Such terms are high-level descriptions. The actual operations or functions/structures that correspond to these terms will vary depending on the particular implementation and are readily discernible by one of ordinary skill in the art.

As used in this disclosure, the singular forms "a," "an," and "the" include the plural forms unless the context clearly dictates otherwise. Additionally, the term "includes" means "comprises." Moreover, unless the context dictates otherwise, the term "coupled" means electrically or electromagnetically connected or linked and includes both direct connections or direct links and indirect connections or indirect links through one or more intermediate elements not affecting the intended operation of the circuit.

Figure 1:
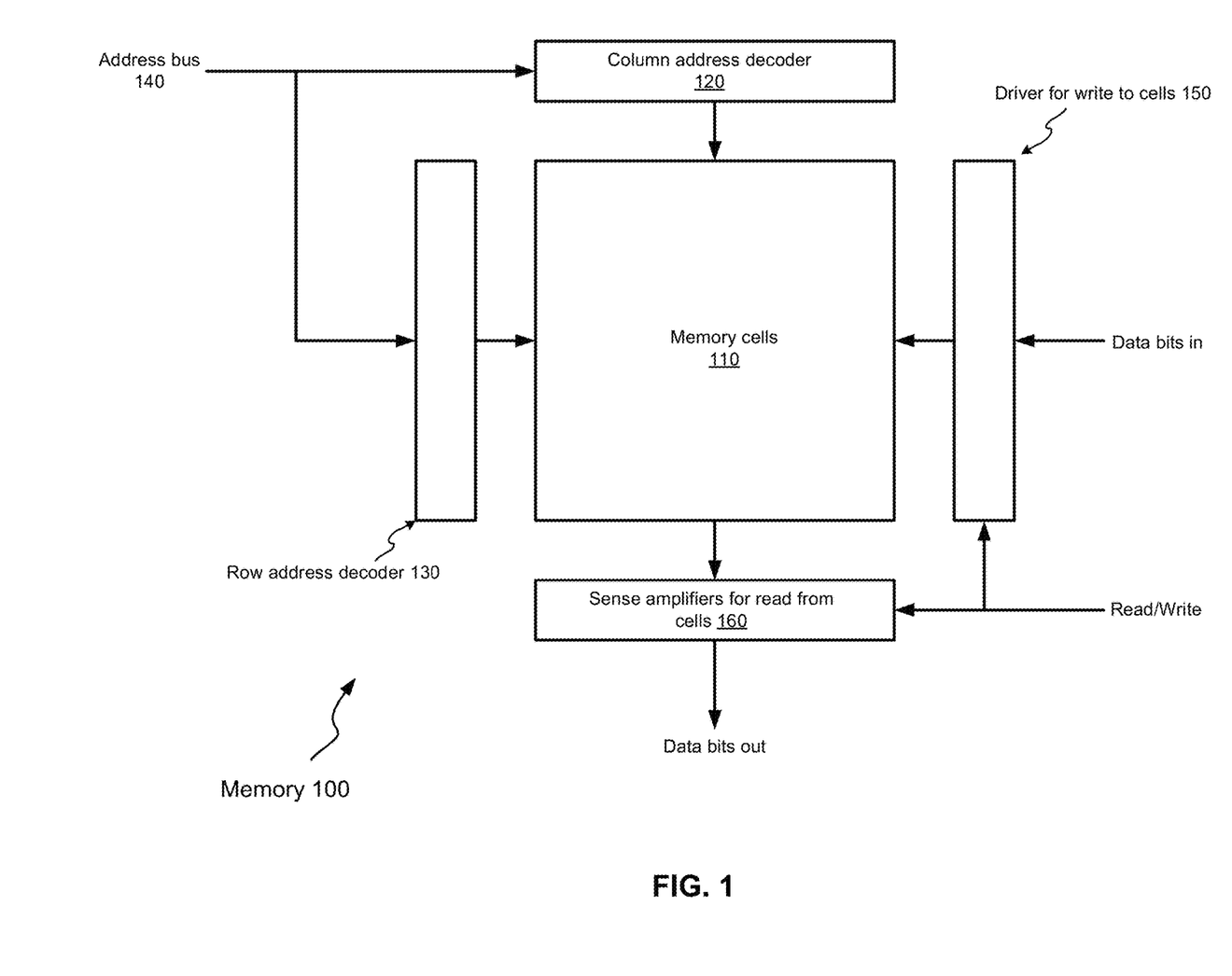
FIG. 1 illustrates an example of a block diagram of a typical memory.

Memories form a large part of system-on-chip circuits. Embedded memories can provide higher bandwidth and consume lower power than stand-alone memories. FIG. 1 illustrates an example of a block diagram of a typical memory 100. The memory 100 comprises memory cells 110, a column address decoder 120, a row address decoder 130, driver circuitry 150, and sense amplifiers 160. The memory cells 110 are connected in a two-dimensional array. Each of the memory cells 110 can store one bit of binary information. The memory cells 110 can be grouped into memory words of fixed word length, for example 1, 2, 4, 8, 16, 32, 64 or 128 bit. A memory cell has two fundamental components: storage node and select device. The storage node stores the data bit for the memory cell, and the select device component facilitates the memory cell to be addressed to read/write in an array.

The row address decoder 130 and the column address decoder 120 determine the cell address that needs to be accessed. Based on the addresses on row address decoder 130 and the column address decoder 120, the corresponding row(s) and column(s) get selected and connected to the sense amplifiers 160. Each of the sense amplifiers 160 amplifies send out a data bit. Similarly, the required cells where the data bits need to be written are selected by the addresses on row address decoder 130 and the column address decoder 120. To write data bits into memory cells, however, the driver 150 is used. The address information is supplied through an address bus 140.

Figure 2:
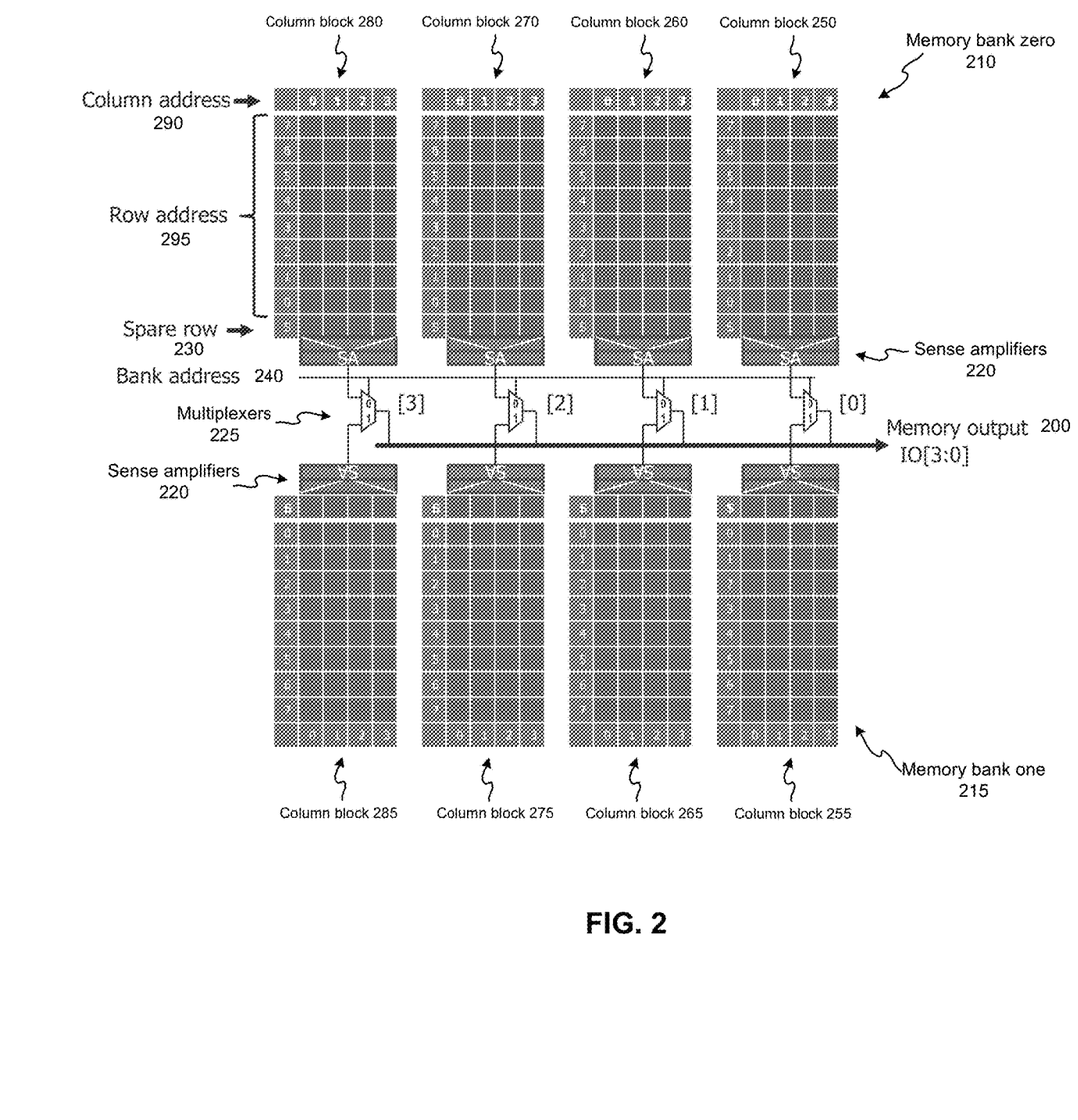
FIG. 2 illustrates an example of a block diagram of a memory cell array.

FIG. 2 illustrates an example of a block diagram of a memory cell array. The memory cell array comprises two memory banks 210 and 215. Each of the memory banks 210 and 215 comprises four column blocks. Here, column blocks 250, 260, 270 and 280 belong to the memory bank 210, while column blocks 255, 265, 275 and 285 are components of the memory bank 215. A memory cell in each of the eight column blocks 250-285 is selected by a combination of column address 290 and row address 295. The output for each of the eight column blocks 250-285 is coupled through a multiplexer to one of sense amplifiers 220. Bank address 240 determines, via multiplexers 225, from which memory bank outputs of the sense amplifiers 220 are coupled to memory outputs 200. For example, if the column address 290, the row address 295, and the bank address 240 are 4, 2, and 0, respectively, bits stored at memory cells at row 4 and column 2 of the column blocks 250, 260, 270 and 280 are outputted as bits 0-3 of a word, respectively. In addition to regular rows 0-7, each of the eight column blocks 250-285 has a spare row 230 which can be used for row repair.

Memories can have a significant impact on yield as they occupy a large area of the system-on-chip design and have a small feature size. However, memory cells typically do not include logic gates and flip-flops. Memory faults thus behave differently than classical stuck-at faults for logic circuits. The large size and high density of memory cell arrays are also not suitable for using external test patterns. As a result, MBIST (memory built-in self-test)-based techniques have become widely adopted for both manufacture testing and in-system testing. MBSIT may implement a finite state machine (FSM) to generate and apply stimuli to memories and then analyze the responses coming out of memories. MBIST-based techniques often add repair circuitry to the memory-testing circuit. The repair circuitry can analyze testing results and redundancy information and allocate spare rows and/or columns of storage cells to faulty rows and/or columns. The repair can reduce yield loss and extend lifespan of manufactured chips.

Figure 3:
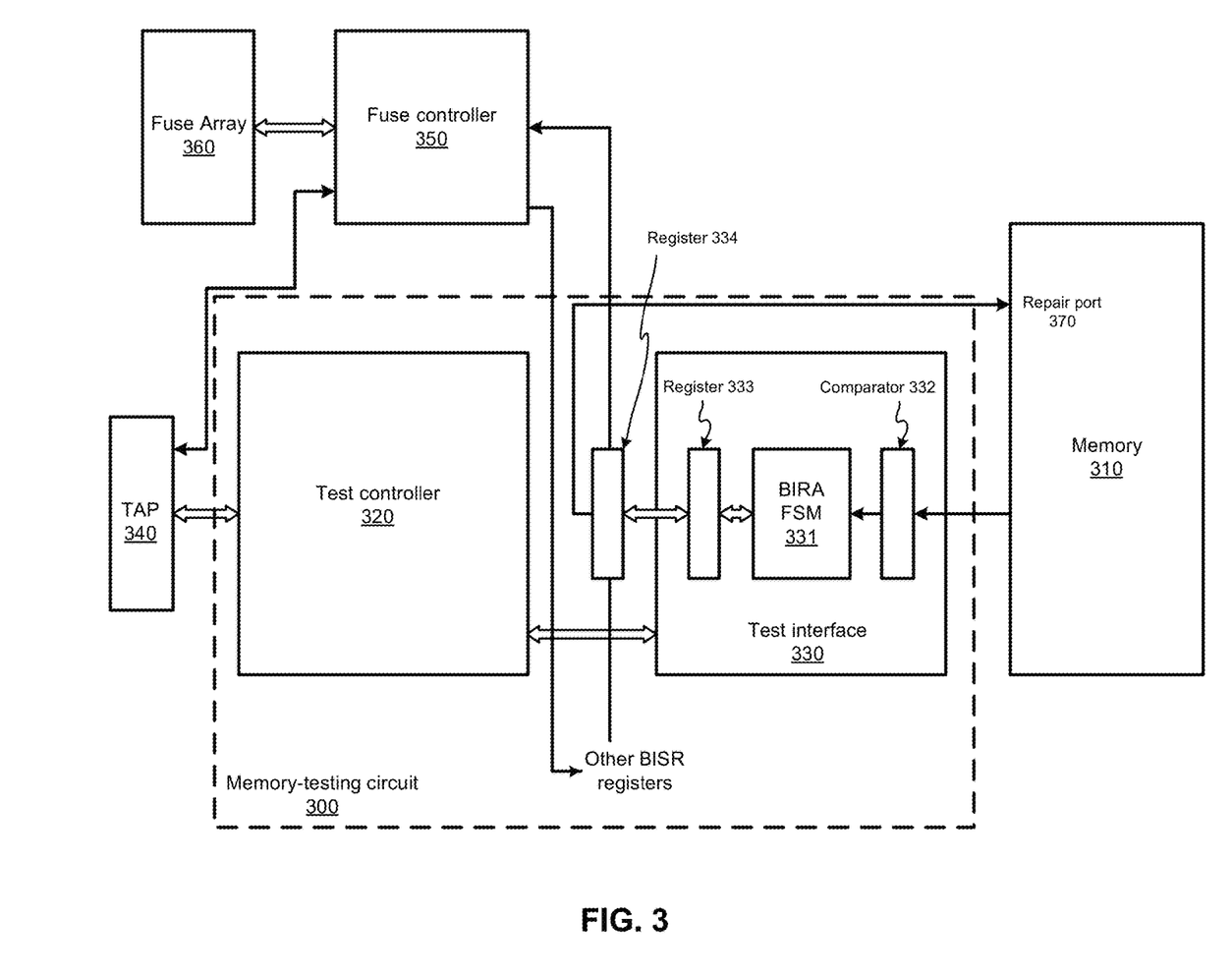
FIG. 3 illustrates an example of a block diagram of a memory-testing circuit.

FIG. 3 illustrates an example of a block diagram of a memory-testing circuit 300. The memory-testing circuit 300, configured to test a memory 310, comprises a test controller 320 and a test interface 330. The test controller 320 is programmed by signals sent via a TAP (test access port) 340. The TAP 340 may be a JTAG (joint test action group) TAP conforming to IEEE Standard 1149.1. The connection between the TAP 340 and the test controller 320 can be, for example, an IJTAG (internal JTAG, IEEE Standard 1687) network. The test controller 320 executes a test by applying a sequence of reads and writes to memory cells in the memory 310 via the test interface 330. Such a sequence of reads and writes is referred to as a memory test algorithm. One example of memory test algorithms is March C− algorithm, which includes the following steps: write 0s (to initialize); read 0s, write is in an address ascending order (from address 0 to address n−1); read is, write 0s in the address ascending order; read 0s, write is in an address descending order (from address n−1 to address 0); read is, write 0s in the address descending order, and reads 0s. Another memory test algorithm, Checkerboard algorithm, includes the following steps: write checkerboard in the address ascending order; read checkerboard in the address ascending order; write inverse checkerboard in the address ascending order; and read inverse checkerboard in the address ascending order.

The test controller 320 can use a finite-state machine (FSM) to control a data generator, an address generator, and a comparator 332. The data generator and the address generator are used for generating and applying test stimuli to the memory 310. They can be in the test controller 320 or in the test interface 330. Neither is shown in FIG. 3. The comparator 332 is used for comparing, bit by bit, the test response coming out of the memory 310 with a reference value. It is shown in the test interface 330 in FIG. 3. Alternatively, the test controller 320 may use a read-only memory (ROM) and a program counter, rather than a finite-state machine, to perform a test. The read-only memory stores test procedures for generating test patterns and the program counter controls the read-only memory.

The test interface 330 also comprises repair circuitry. The repair circuitry comprises a built-in redundancy analysis (BIRA) module 331 and a BIRA register 333. BIRA is sometimes referred to as built-in repair analysis as well. The BIRA module 331 is configured to determine whether the memory 310 is repairable based on results provided by the comparator 332 and to determine, if repairable, a repair solution like allocating one or more spare rows or row blocks for one or more defective rows or row blocks. The BIRA module 331 stores the repair solution in the BIRA register 333. The repair solution can then be transferred to a register 334 on a repair register scan chain. The repair solution can be applied to the memory 310 through a path from the register 334 to a repair port 370. The repair register scan chain can transport the repair solution to a fuse controller 350. The fuse controller 350 can then compress the repair solution and burn the compressed solution into a fuse array 360 by applying high voltage pulses. The reading and writing of the fuse array 360 is controlled by signals supplied through the TAP 340. Upon a circuit power-up or reset, all compressed repair solution stored in the fuse array 360 is automatically decompressed and scanned into corresponding registers such as the register 334 on the repair register scan chain, resulted in all memories being repaired.

Figure 4:
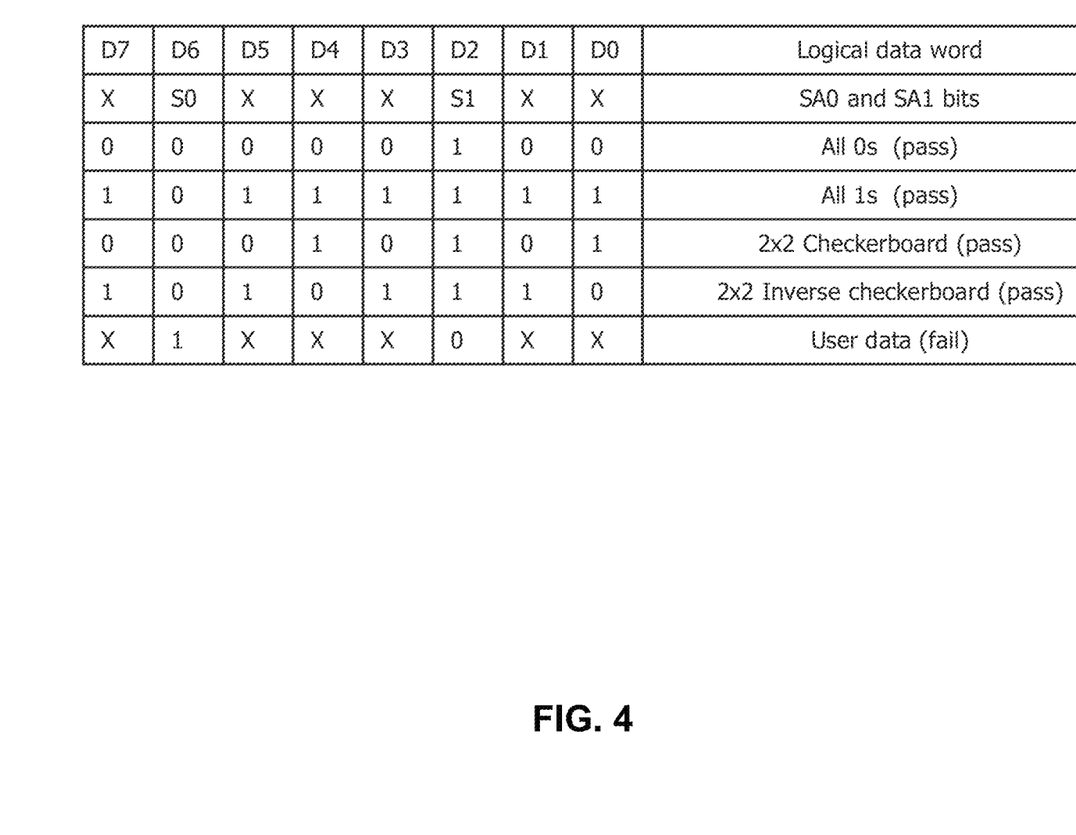
FIG. 4 illustrates an example of one type of test escapes caused by combining the redundancy-based memory repair with the ECC-based memory repair.

Applying a conventional memory repair technique to a memory that also uses ECC for repair can lead to test escapes when the ECC circuitry is enabled. FIG. 4 illustrates an example of one type of test escapes caused by combining the redundancy-based memory repair with the ECC-based memory repair. In this example, the memory has an 8-bit data path and is set to be repaired by ECC for a single-bit error and by redundancy for a multiple-bit error. Assume that Bit 2 has a stuck-at-1 fault and Bit 6 has a stuck-at-0 fault. If a test pattern pair of all 0s and all 1s are used to test memories, only the stuck-at-1 error is detected when reading back the all 0s pattern and only the stuck-at-0 error is detected when reading back the all 1s pattern. The single-error detection results leads to a conclusion that no redundancy-based repair is needed, but the ECC-based repair is not set up for fixing two-bit errors in this example.

For memories without a column multiplexer, a checkerboard-like test pattern and its inverse can be applied. Like the all 0s pattern and the all 1s pattern, only one of the two errors can be detected and ECC appears to be able to repair this memory. However, any pattern containing a 0 for bit 2 and a 1 for bit 6 would cause a failure in the system. One solution would be doubling the number of test patterns applied during a test for detecting all 2-bit combinations in an 8-bit data path as shown in FIG. 4. This is, however, not an efficient solution because the number of test patterns (M) increases with the data path width (N) according to Equation (1):

$$M = 2 * \log_2(N+2) \quad (1)$$

Increasing the number of data patterns can increase test time significantly. P. Papavramidou and M. Nicolaidis propose using a content addressable memory (CAM) to keep track of failing addresses and the bits that failed for each of the failing addresses in "Test Algorithms for ECC-based Memory Repair in Nanotechnologies," Proc. IEEE 30th VLSI Test Symposium, 2012, pp. 228-233. But this solution could be expensive in terms of silicon area costs and additional testing of the CAM itself.

Figure 5:
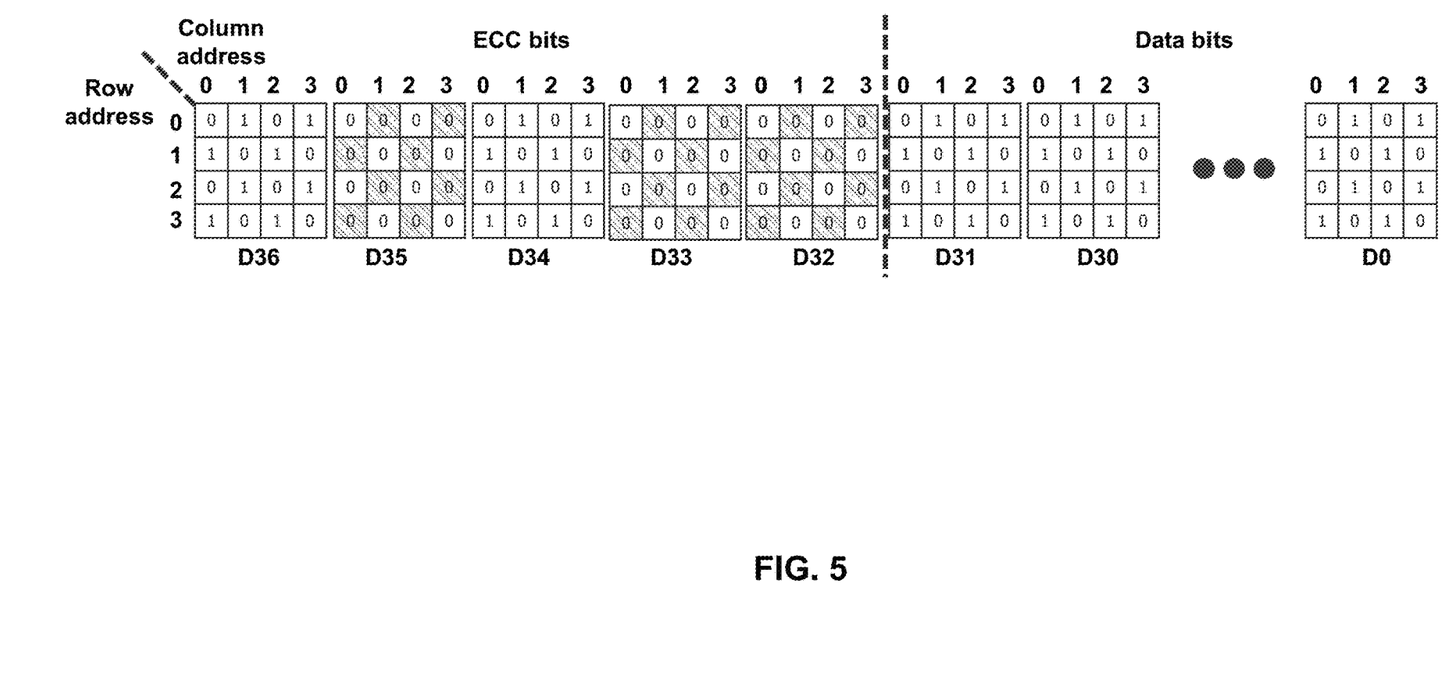
FIG. 5 illustrates an example of another type of test escapes caused by combining the redundancy-based memory repair with the ECC-based memory repair.

FIG. 5 illustrates an example of another type of test escapes caused by combining the redundancy-based memory repair with the ECC-based memory repair. In this example, the memory has 37 bits, of which bit 0 (D0) through bit 31 (D31) are used for storing data bits and bit 32 (D32) through bit 36 (D36) are used for storing ECC bits. For a particular ECC encoding scheme, the code for the all 0s data pattern is 00000 and the code for the all 1s data pattern is 10100. This means that 3 bits (D32, D33 and D35) of every word never toggle when testing for bit line shorts by applying a physical checkerboard pattern to the memory. Similar to the first type of test escapes, additional test patterns are required. These test patterns are not necessarily the same as the ones used for the detection of multiple errors in the data bits as they depend on the actual encoding scheme. This not only increases test time but also makes it difficult to predict the fault coverage. K. Kushida et al. propose modifying the error-correcting code to avoid this issue in "DFT Techniques for Memory Macro with Built-in ECC," Proc. IEEE International Workshop on Memory Technology, Design and Testing 2005. This, however, may not always be possible if the ECC logic is already in the design at the time MBIST is inserted.

Figure 6:
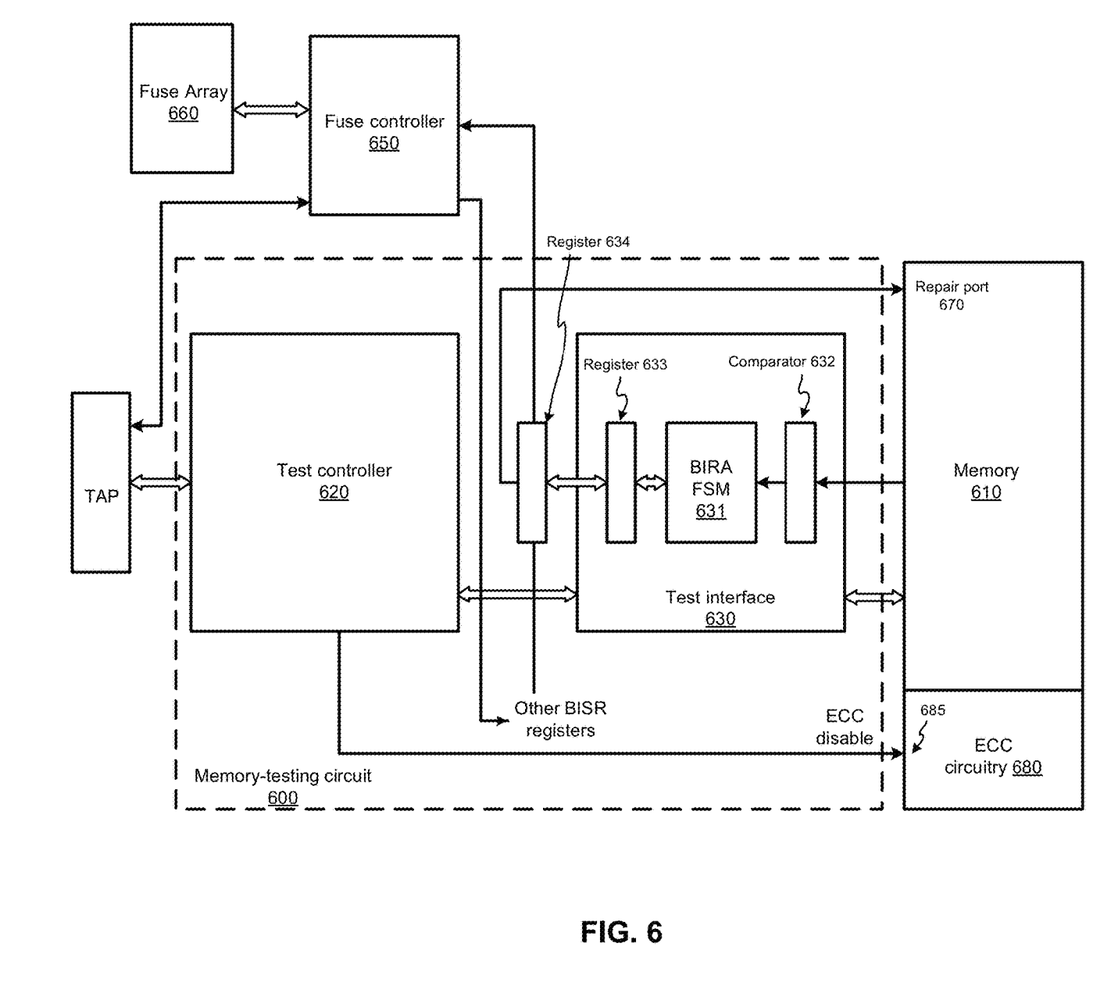
FIG. 6 illustrates an example of a block diagram of a memory-testing circuit that can perform memory repairs based on a combination of redundancy and ECC while avoiding potential test escapes according to various embodiments of the disclosed technology.

FIG. 6 illustrates an example of a block diagram of a memory-testing circuit 600 that can perform memory repairs based on a combination of redundancy and ECC while avoiding potential test escapes according to various embodiments of the disclosed technology. Similar to the memory-testing circuit 300 in FIG. 3, the memory-testing circuit 600 comprises a test controller 620 and a test interface 630, configured to test a memory 610. The test interface 630 comprises a comparator 632, a BIRA module 631 and a BIRA register 633. The latter two devices are a part of repair circuitry. Unlike FIG. 3, the memory 610 is shown to have error-correcting code circuitry 680. The test controller 620 supplies an ECC disable/enable signal to a port 685 of the error-correcting code circuitry 680. The comparator 632 can compare, bit by bit, a test response coming out of the memory 610 with a reference value. The repair circuitry can determine, when spare elements are available, a redundancy-based repair solution for defective elements in the memory 610 that are not correctable by the error-correcting code circuitry 680. The redundancy-based repair solution can be transferred from the BIRA register 633 to a register 634 and scanned into a fuse controller 650. The fuse controller 650 can then compress the repair solution and store the result into a fuse array 660. Upon a circuit power-up or reset, the compressed repair solution is automatically decompressed and scanned back into the register 634 via the repair register scan chain. The register 634 can apply the redundancy-based repair solution to the memory 610 through a repair port 670.

Figure 7:
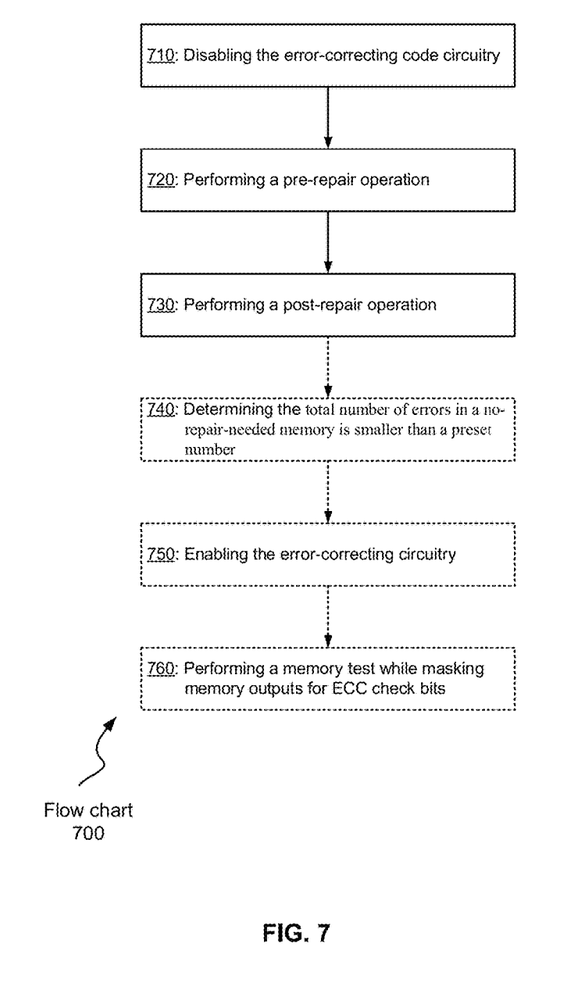
FIG. 7 illustrates a flowchart showing a process for testing and repairing memories that may be implemented according to various examples of the disclosed technology.

FIG. 7 illustrates a flowchart showing a process for testing and repairing memories that may be implemented according to various examples of the disclosed technology. For ease of understanding, methods for testing and repairing memories that may be employed according to various embodiments of the disclosed technology will be described with reference to the memory-testing circuit 600 illustrated in FIG. 6 and the flow chart 700 illustrated in FIG. 7. It should be appreciated, however, that a different memory-testing circuit may be used to perform the method for testing and repairing memories illustrated by the flow chart 700 according to various embodiments of the disclosed technology. Likewise, the memory-testing circuit 600 may be employed to perform other methods for testing and repairing memories according to various embodiments of the disclosed technology.

In operation 710 of the flow chart 700, the test controller 620 disables the error-correcting code circuitry 680. The error-correcting code circuitry 680 is configured to, when enabled, detect and correct no more than a first preset number of error bits per memory word detected in the memory 610. Disabling it during a memory test can avoid the type of test escapes shown in FIG. 5 because ECC bits would be treated the same as data bits.

In operation 720, the memory-testing circuit 600 performs a pre-repair operation. The pre-repair operation comprises: determining whether the memory 610 has one or more defective rows or row blocks, and allocating one or more spare rows or row blocks for the one or more defective rows or row blocks if the one or more spare rows or row blocks are available. A defective row or row block is a row or row block in which a memory word has a number of error bits greater than a second preset number. A row block may be a set of neighboring rows or a set of rows sharing some circuitry. For some memory architectures, one defective row would warrant a replacement of the row block where the defective row is located. The second preset number is equal to or smaller than the first preset number. In some applications, it is smaller than the first preset number because some ECC capability after repairing manufacture defects is needed to deal with soft errors or defects encountered during the lifetime of a manufactured chip. Assume the error-correcting code circuitry 680 can detect and correct up to 3 bit errors (the first preset number=3). During a manufacture test, a row of a memory on a chip is found to have defects with three memory cells, but no spare row is allocated for it. This chip would not function well if the same row suffers even just one-bit soft error during an operation. The second preset number may be set as 1 or 2 to avoid such a problem.

The second preset number may even be set as 0 during a manufacturing test. As such, only redundancy-based repair is considered. When the memory is retested in a system, the second preset number may be set to be a non-zero number, allowing the system to tolerate aging faults by using the error-correcting code circuitry 680. In some embodiments of the disclosed technology, the second preset number may be adjusted during a manufactured test to a value to achieve a certain yield.

On the other hand, a memory may not have any spare rows or columns and only ECC-based repair is available. In this case, the disclosed technology can still be employed to determine whether a chip containing such a memory has defective memory cells and if yes, whether the chip can be "repaired" by ECC.

Figure 8:
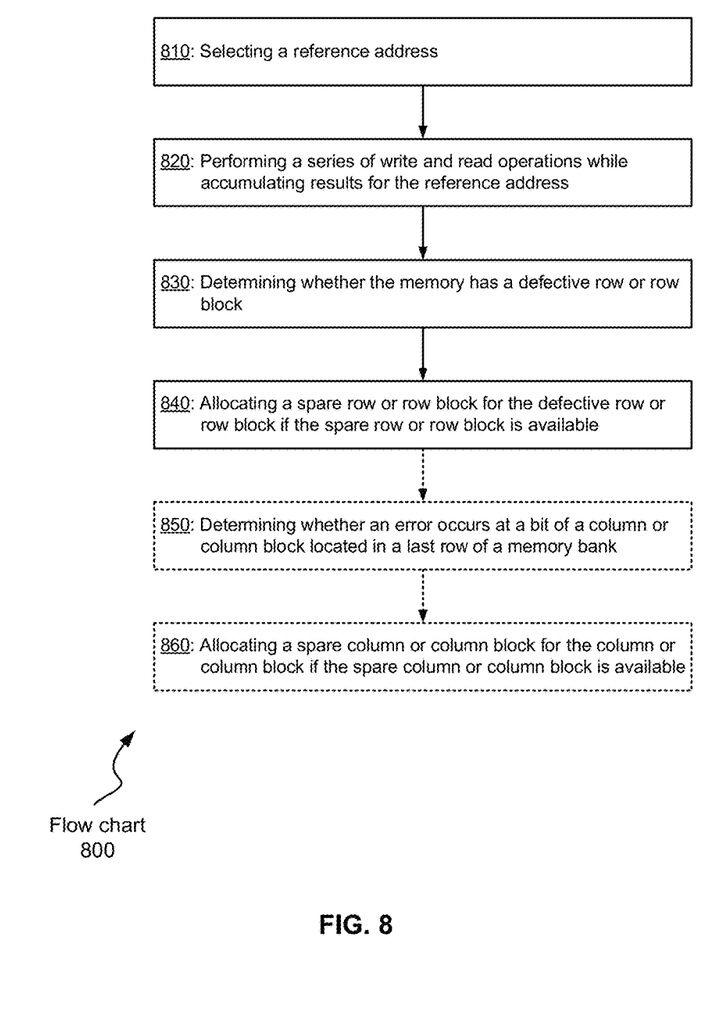
FIG. 8 illustrates a flowchart showing an example of a process for testing and repairing memories that may be employed by the pre-repair operation and the post-repair operation according to various examples of the disclosed technology.

FIG. 8 illustrates a flowchart 800 showing an example of a process for testing and repairing memories that may be employed by the pre-repair operation and the post-repair operation according to various examples of the disclosed technology. In operation 810, the memory-testing circuit 600 selects a reference address. In operation 820, the memory-testing circuit 600 performs a series of write and read operations while accumulating results for the reference address. The accumulation of test results related to a reference address before making a decision to repair with a spare row can help eliminate the type of test escapes shown in FIG. 4. In operation 830, the BIRA module 631 determines whether the memory 610 has a defective row or row block based on the result of the series of write and read operations. In operation 840, the BIRA module 631 allocates a spare row or row block for the defective row or row block if a spare row or row block is available. The operations 810-840 are repeated for all of the addresses of the memory 610 that need to be tested.

The memory-testing circuit 600 can employ various memory test algorithms for the operation 820. The conventional BitSurroundDisturb algorithm includes the following steps: 1) For all reference addresses: a) write 0 at reference cell, b) perform read and write operations for all 8 physically adjacent cells interleaved with read operations to the reference cell; and 2) repeat step 1 with inverted data. To address the type of test escapes shown in FIG. 4, the memory-testing circuit 600 can employs a modified BitSurroundDisturb algorithm: 1) For all reference addresses: a) write 0 at reference cell, b) perform read write operations for all 8 physically adjacent cells interleaved with read operations to the reference cell, but only compare results of read operations performed at the reference cell; and 2) repeat step 1 with inverted data. The modified BitSurroundDisturb algorithm can detect content corruption of a reference cell by other cells.

Optionally, in operation 850, the BIRA module 631 further determines whether the memory 610 has a defective column or column block based on the result of the series of write and read operations. In some embodiments of the disclosed technology, a defective column is a column of which a bit located in a last row of a memory bank is defective. In some other embodiments of the disclosed technology, a defective column is a column that has the largest number of errors if the largest number of errors is greater than a third preset number. A column block may be a set of columns sharing an output like those shown in FIG. 1 or a set of neighboring columns. For some memory architectures, one defective column would warrant a replacement of the column block where the defective column is located. In operation 860, the BIRA module 631 allocates a spare column or column block for the defective column or column block if a spare column or column block is available.

Figure 9:
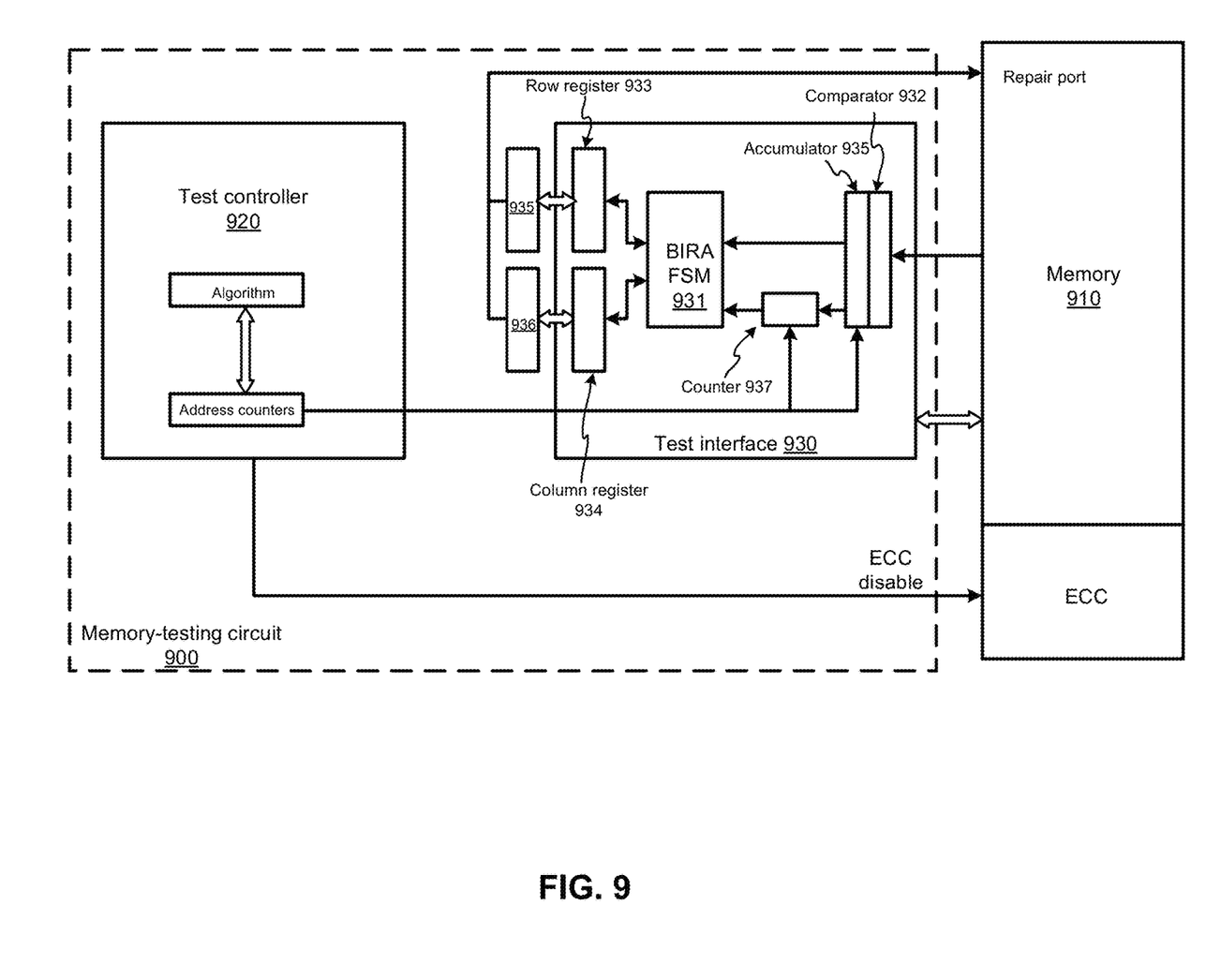
FIG. 9 illustrates an example of a more detailed block diagram of a memory-testing circuit that combines redundancy and ECC for memory repair while avoiding potential test escapes according to various embodiments of the disclosed technology.

FIG. 9 illustrates an example of a more detailed block diagram of a memory-testing circuit 900 that combines redundancy and ECC for memory repair while avoiding potential test escapes according to various embodiments of the disclosed technology. The memory-testing circuit 900 comprises a test controller 920 and a test interface 930, configured to test a memory 910. In the test interface 930, an accumulator 935 is shown behind a comparator 932. The accumulator 935 is configured to perform the accumulation operation described in the operation 820 of the flow chart 800. Specifically, the accumulator 935 can accumulate results of the comparing for each of the outputs of the memory obtained by the comparator 932 and to indicate whether at least one error occurred in the each of the outputs of the memory after a series of write and read operations for a reference address selected by the test controller 920. The test interface 930 is shown to have a fail count device 937. The fail count device 937 is configured to count a number of failing bit positions at the reference address and to send a signal to a BIRA module 931 indicating whether the number of failing bit positions exceeds the second preset number.

The BIRA module 931 can also determine whether an error occurs at a bit of a column or column block located in a last row of a memory bank, whether a column or column block having a largest number of errors is greater than a third preset number, or both. Again, the last row refers to a row farthest away from output circuitry of the memory bank. The BIRA module 931 can determine a row repair solution and a column repair solution if the corresponding redundancy resources are available. The row repair solution and the column repair solution can be stored in a BIRA row register 933 and a BIRA column register 934, respectively. The solutions can then be transferred to a register 935 and a register 936, respectively, for applying the solutions to the memory 910 and for transporting to a non-volatile memory for storage.

Refer back to the flow chart 700. In operation 730, the memory-testing circuit 600 performs a post-repair operation. The post-repair solution is similar to the pre-repair operation except that the post-repair solution is performed on the memory 610 to which the repair solution derived from the pre-repair solution is being applied. The error-correcting code circuitry 680 is still being disabled and the algorithms used during the operation 720 are applied again. This can test the spare elements allocated during pre-repair operation including ECC bits. It is possible that new errors require a use of additional spare elements. If the errors occur in a row in the main memory core, a new spare row may be allocated, if available. This situation might happen due to marginal conditions causing intermittent errors to occur. In another case, errors occur in one of the spare rows already allocated. The memory may be declared as non-repairable or the spare row is marked as bad and a new spare row, if available, is allocated.

The pre-repair operation performed in the operation 720 and the post-repair operation performed in the operation 730 classify the memory 610 into four categories: non-repairable, repair-needed, no-repair-needed, and error-free. A non-repairable memory comprises a memory in which the number of defective rows or row blocks exceeds the number of available spare rows or row blocks. A non-repairable memory may further comprise a memory in which the number of defective columns or column blocks exceeds the number of available spare columns or column blocks. A repair-needed memory comprises a memory having spare elements available for any defective elements determined. A no-repair-needed memory is a memory in which a number of errors in any memory word is equal to or smaller than the second preset number. An error-free memory is a memory in which no errors are detected.

Optionally, in operation 740, the memory-testing circuit 600 determines whether the total number of errors in the memory 610 is smaller than a fourth preset number. This operation may be useful for applications requiring very high reliability since too many errors may indicate that the memory is susceptible to errors or has a short lifetime. The operation may comprise: loading the threshold value in a diagnostic error counter and running in a diagnosis mode.

Also optionally, in operation 750, the test controller 620 enables the error-correcting code circuitry 680. In operation 760, the memory-testing circuit 600 performs a memory test while masking memory outputs for ECC check bits. No errors are allowed on data bits. The memory test may use various conventional memory algorithms.

Figure 10:
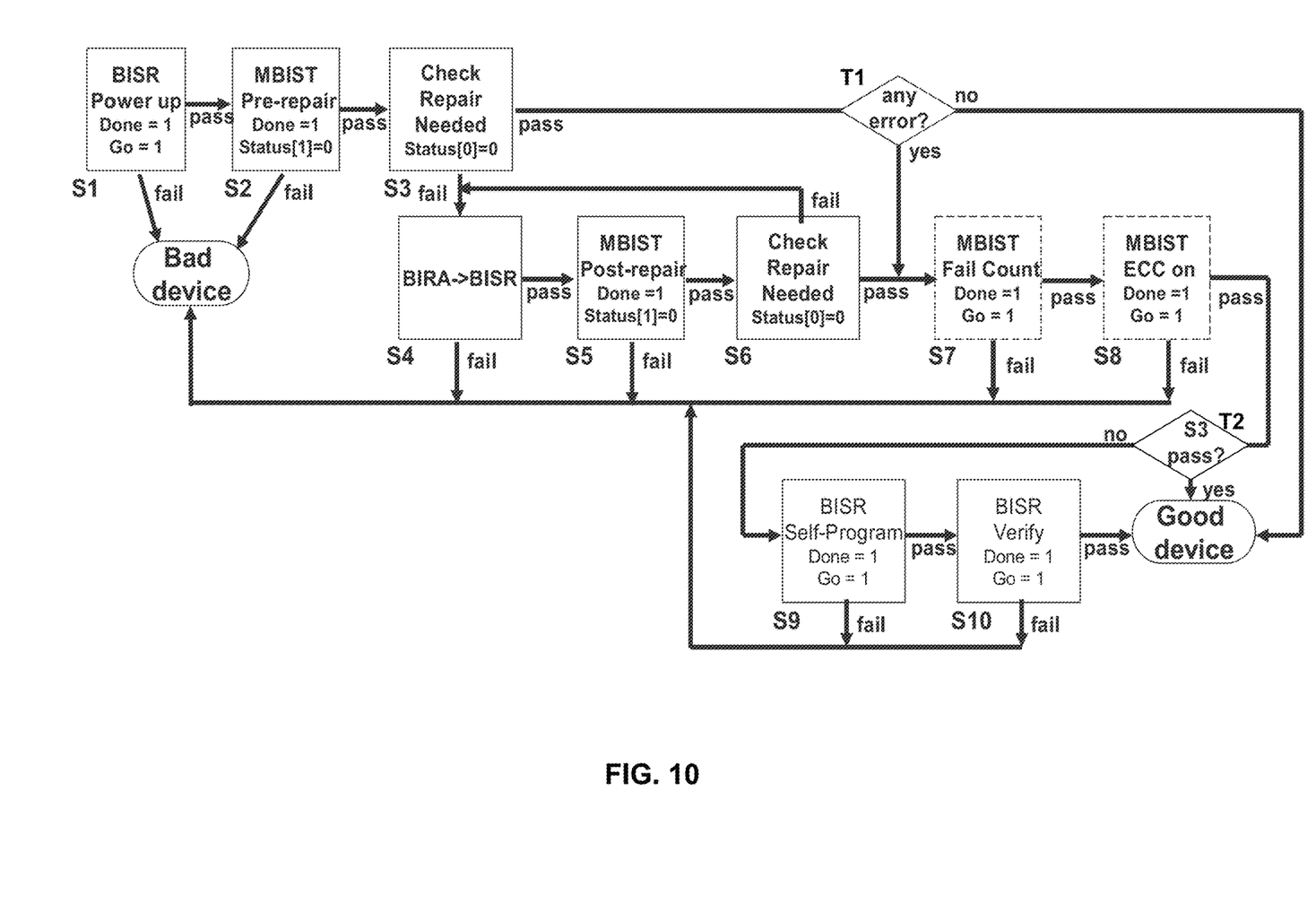
FIG. 10 illustrates an example of a test and repair flow that may be implemented according to various examples of the disclosed technology.

FIG. 10 illustrates an example of a test and repair flow that may be implemented according to various examples of the disclosed technology. This test and repair flow includes no optimization of memory input/output repair. In box S1, the repair circuitry 600 is powered up, and the repair solution stored in the fuse array 660 is read, decompressed and scanned into the register 634. The box S1 makes a consistency check whether the repair solution length matches the length of the register 634. If it fails, the memory is designated as a bad device. Otherwise, the flow moves to box S2, in which the repair circuitry 600 performs a pre-repair operation after the error-correcting code circuitry 680 is disabled (the operations 710 and 720 of the flow chart 700). The result of the pre-repair operation is indicated by two repair status bits, Status[0] and Status[1]. The box S2 checks Status[1] indicating whether spare rows are available for defective rows detected. If it passes, the flow moves to box S3. The box S3 checks Status[0] indicating whether the memory 610 needs redundancy-based repair. If no redundancy-based repair is needed, the flow moves to box T1, which checks whether the memory 610 has any errors. If no errors are detected by the pre-repair operation, the memory 610 is designated as an error-free good device.

If the memory 610 needs redundancy-based repair, the flow moves from the box S3 to box S4. In the box S4, the repair solution derived by the pre-repair operation is transferred from the BIRA register 633 to the register 634, and then applied to the memory 610. If the operation in S4 is successful, the flow moves to box S5. In the box S5, the repair circuitry 600 performs a post-repair operation while the error-correcting code circuitry 680 is still disabled (the operation 730 of the flow chart 700). The result of the post-repair operation changes Status[0] and Status[1] accordingly. The box S5 checks Status[1] indicating whether spare rows are available for newly-detected defective rows. If it passes, the flow moves to box S6. The box S6 checks Status[0] indicating whether the memory 610 needs further redundancy-based repair in the post-repair operation. If the answer is yes, the flow moves back to the box S4 and the newly-repaired memory 610 is tested again. Otherwise, the flow moves to box S7 and then box S8. These two are optional steps. In the box S7, the repair circuitry 600 determines whether the total number of errors in the memory 610 is smaller than the fourth preset number (the operation 740 of the flow chart 700). In the box S8, the repair circuitry 600 performs a memory test while enabling the error-correcting code circuitry 680 and masking memory outputs for ECC check bits (the operations 750 and 760 of the flow chart 700). The flow then passes through box T2 and reaches boxes S9 and S10 in sequence. In the box S9, the repair solution is transferred from the BIRA register 633 to the register 634 and scanned into the fuse controller 650. The fuse controller 650 then compresses the repair solution and store the result into the fuse array 660. In the box S10, the repair circuitry 600 checks whether the repair solution stored in the fuse array 660 is the same as the originally-derived. If checks in both of the boxed S9 and S10 are passed, the memory 610 is designated as a repair-needed good device.

Another way to reach the box S7 is through the box T1 when the memory 610 has errors correctable by the error-correcting code circuitry 680. If the flow reaches box T2 through this route, the memory 610 is designated as a no-repair-needed good device.

CONCLUSION

Having illustrated and described the principles of the disclosed technology, it will be apparent to those skilled in the art that the disclosed embodiments can be modified in arrangement and detail without departing from such principles. In view of the many possible embodiments to which the principles of the disclosed technologies can be applied, it should be recognized that the illustrated embodiments are only preferred examples of the technologies and should not be taken as limiting the scope of the disclosed technology. Rather, the scope of the disclosed technology is defined by the following claims and their equivalents. We therefore claim as our disclosed technology all that comes within the scope and spirit of these claims.

What is claimed is:

1. A memory-testing circuit in a circuit configured to perform a test of a memory in the circuit, the memory comprising error-correcting code circuitry configured to detect and correct no more than a first preset number of error bits per memory word detected in the memory, the memory-testing circuit comprising: a test controller; and repair circuitry configured to allocate a spare row or row block in the memory fora defective row or row block in the memory, a defective row or row block being a row or row block in which a memory word has a number of error bits greater than a second preset number, the second preset number being equal to or smaller than the first preset number, wherein the test of the memory comprises: disabling the error-correcting code circuitry by the test controller, performing a pre-repair operation, the pre-repair operation comprising: determining whether the memory has one or more defective rows or row blocks, and allocating one or more spare rows or row blocks for the one or more defective rows or row blocks if the one or more spare rows or row blocks are available, and performing a post-repair operation, the post-repair operation comprising: determining whether the memory has one or more new defective rows or row blocks after the pre-repair operation, and allocating one or more new spare rows or row blocks for the one or more new defective rows or row blocks if the one or more new spare rows or row blocks are available; wherein each of the determining whether the memory has one or more defective rows or row blocks and the determining whether the memory has one or more new defective rows or row blocks after the pre-repair operation comprises: selecting a reference address; and performing a series of write and read operations while accumulating results for the reference address.

2. The circuit recited in claim 1, wherein the series of write and read operations comprises writing and reading at the reference address and addresses other than the reference address, and the results for the reference address are derived by comparing bits at the reference address with expected bit values.

3. The circuit recited in claim 1, wherein the series of write and read operations comprise reading a value of 0 and 1 from all bits of the reference address.

4. The circuit recited in claim 1, wherein the memory-testing circuit further comprises:
a comparator configured to compare bit values from outputs of the memory with expected bit values;
an accumulator configured to accumulate results of the comparing for each of the outputs of the memory and to indicate whether at least one error occurred in the each of the outputs of the memory after a series of write and read operations for a reference address selected by the test controller; and
a fail count device configured to count a number of failing bit positions at the reference address and to send a signal to the repair circuitry indicating whether the number of failing bit positions exceeds the second preset number.

5. The circuit recited in claim 1, wherein the repair circuitry is further configured to allocate a spare column or column block to a column or column block if an error occurs at a bit of the column or column block located in a last row of a memory bank in either the pre-repair operation or the post-repair operation, the last row being a row farthest away from output circuitry of the memory bank.

6. The circuit recited in claim 1, wherein the memory-testing circuit further comprises a counter for each memory bit output configured to count a number of errors, and wherein the repair circuitry is further configured to allocate a spare column or column block to a column or column block having a largest number of errors if the largest number of errors is greater than a third preset number.

7. The circuit recited in claim 1, wherein the test of the memory classifies the memory as:
non-repairable, non-repairable memory comprising memory in which a number of defective rows or row blocks exceeds a number of available spare rows or row blocks,
repair-needed, repair-needed memory comprising memory having spare rows or row blocks available for any defective rows or row blocks determined,
no-repair-needed if a number of errors in any memory word is equal to or smaller than the second preset number, or
error-free if no errors are detected.

8. The circuit recited in claim 1, wherein the test of the memory further comprises:
determining whether a total number of errors for correction by the error-correcting code circuitry is smaller than a fourth preset number.

9. The circuit recited in claim 1, wherein the test of the memory further comprises:
enabling the error-correcting code circuitry by the test controller;
masking memory outputs corresponding to check bits used by the error-correcting code circuitry;
performing a series of write and read operations; and
comparing results the series of write and read operations with expected results.

10. A method for testing a memory in a circuit by using a memory-testing circuit in the circuit, comprising: disabling error-correcting code circuitry in the circuit, the error-correcting code circuitry configured to, when enabled, detect and correct no more than a first preset number of error bits per memory word detected in the memory; performing a pre-repair operation, the pre-repair operation comprising: determining whether the memory has one or more defective rows or row blocks, and allocating one or more spare rows or row blocks in the memory for the one or more defective rows or row blocks if the one or more spare rows or row blocks are available, a defective row or row block being a row or row block in which a memory word has a number of error bits greater than a second preset number, the second preset number being equal to or smaller than the first preset number; and performing a post-repair operation, the post-repair operation comprising: determining whether the memory has one or more new defective rows or row blocks after the pre-repair operation, and allocating one or more new spare rows or row blocks for the one or more new defective rows or row blocks if the one or more new spare rows or row blocks are available; wherein each of the determining whether the memory has one or more defective rows or row blocks and the determining whether the memory has one or more new defective rows or row blocks after the pre-repair operation comprises: selecting a reference address; and performing a series of write and read operations while accumulating results for the reference address.

11. The method recited in claim 10, wherein the series of write and read operations comprises writing and reading at the reference address and addresses other than the reference address, and the results for the reference address are derived by comparing bits at the reference address with expected bit values.

12. The method recited in claim 10, wherein the series of write and read operations comprise reading a value of 0 and 1 from all bits of the reference address.

13. The method recited in claim 10, wherein each of the pre-repair operation and the post-repair operation comprises:
   allocating a spare column or column block to a column or column block if an error occurs at a bit of the column or column block located in a last row of a memory bank in either the pre-repair operation or the post-repair operation, the last row being a row farthest away from output circuitry of the memory bank.

14. The method recited in claim 10, wherein each of the pre-repair operation and the post-repair operation comprises:
   allocating a spare column or column block to a column or column block having a largest number of errors if the largest number of errors is greater than a third preset number.

15. The method recited in claim 10, wherein the pre-repair operation and the post-repair operation classify the memory as:
   non-repairable, non-repairable memory comprising memory in which a number of defective rows or row blocks exceeds a number of available spare rows or row blocks,
   repair-needed, repair-needed memory comprising memory having spare rows or row blocks available for any defective rows or row blocks determined,
   no-repair-needed if a number of errors in any memory word is equal to or smaller than the second preset number, or
   error-free if no errors are detected.

16. The method recited in claim 10, further comprising:
   determining whether a total number of errors for correction by the error-correcting code circuitry is smaller than a fourth preset number.

17. The method recited in claim 10, further comprising:
   enabling the error-correcting code circuitry;
   masking memory outputs corresponding to check bits used by the error-correcting code circuitry;
   performing a series of write and read operations; and
   comparing results the series of write and read operations with expected results.

18. The method recited in claim 10, wherein the pre-repair operation further comprises:
   reading a repair solution from non-volatile memory in the circuit; and
   generating incrementally a new repair solution.

* * * * *